(12) United States Patent
Park et al.

(10) Patent No.: US 9,300,003 B2
(45) Date of Patent: Mar. 29, 2016

(54) MEANDERING CORRECTION APPARATUS FOR ELECTRODE ASSEMBLY

(71) Applicant: LG CHEM, LTD., Seoul (KR)

(72) Inventors: Ji Won Park, Daejeon (KR); Myung Hoon Ko, Daejeon (KR); Chang Bum Ahn, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/475,246

(22) Filed: Sep. 2, 2014

(65) Prior Publication Data

US 2015/0033527 A1    Feb. 5, 2015

Related U.S. Application Data

(63) Continuation of application No. PCT/KR2014/002684, filed on Mar. 28, 2014.

(30) Foreign Application Priority Data

Aug. 5, 2013 (KR) .................... 10-2013-0092394

(51) Int. Cl.
*H01M 10/04* (2006.01)
*H01M 2/14* (2006.01)
(Continued)

(52) U.S. Cl.
CPC ....... *H01M 10/0404* (2013.01); *H05K 13/0015* (2013.01); *H01M 2/168* (2013.01); *Y10T 29/5193* (2015.01); *Y10T 29/53135* (2015.01); *Y10T 29/53261* (2015.01)

(58) Field of Classification Search
CPC ............ H01M 2/168; H01M 10/0404; H05K 13/0015; H05K 13/0452; Y10T 29/53135; Y10T 29/53252; Y10T 29/53261

USPC ........ 29/33 M; 156/380.2, 580, 583.1, 583.7, 156/583.9; 269/99
See application file for complete search history.

(56) References Cited

U.S. PATENT DOCUMENTS 445,678 A     2/1891  Marshall
4,016,638 A *  4/1977  Klein .............................. 29/730
(Continued)

FOREIGN PATENT DOCUMENTS

EP      0 235 415 A1    9/1987
JP      2000-182609 A   6/2000
(Continued)

OTHER PUBLICATIONS

JPO Machine Translation for JP 2012204172 A—Kikuchi, Junichi, "Manufacturing System of Battery Pack," Oct. 22, 2012.*
(Continued)

*Primary Examiner* — Erica E Cadugan
*Assistant Examiner* — Michael Vitale
(74) *Attorney, Agent, or Firm* — Birch, Stewart, Kolasch & Birch, LLP

(57) ABSTRACT

Provided is a meandering correction apparatus for an electrode assembly. The meandering correction apparatus for the electrode assembly, which corrects a position of a second unit cell to align a first unit cell with the second unit cell in the electrode assembly in which the first and second unit cells having sizes different from each other are folded through a separator, includes a main body on which the electrode assembly is disposed, a movable jig unit disposed on one side of the main body to press one side surface of the electrode assembly, thereby moving the electrode assembly toward the other side of the main body, and a correction jig unit disposed on the other side of the main body to support the other side surface of the electrode assembly that moves by the movable jig unit, thereby correcting the position of the second unit cell.

9 Claims, 10 Drawing Sheets

(51) Int. Cl.
*H05K 13/00* (2006.01)
*H01M 2/16* (2006.01)

(56) References Cited

U.S. PATENT DOCUMENTS

| | | | | |
|---|---|---|---|---|
| 4,489,927 | A * | 12/1984 | Yamada et al. | 269/137 |
| 4,689,108 | A * | 8/1987 | Barry et al. | 156/499 |
| 4,930,760 | A * | 6/1990 | Mirkovic | 269/99 |
| 5,289,861 | A | 3/1994 | Hedrick | |
| 7,017,637 | B2 * | 3/2006 | Ueyama et al. | 156/382 |
| 2002/0160257 | A1 | 10/2002 | Lee et al. | |
| 2002/0160258 | A1 | 10/2002 | Lee et al. | |
| 2003/0013012 | A1 | 1/2003 | Ahn et al. | |
| 2005/0255372 | A1 | 11/2005 | Lertola | |
| 2005/0271932 | A1 | 12/2005 | Wang Chen | |
| 2008/0305398 | A1 | 12/2008 | Komiya | |
| 2012/0043408 | A1 | 2/2012 | Oh et al. | |
| 2012/0225345 | A1 | 9/2012 | Kim | |
| 2013/0000458 | A1 | 1/2013 | Ueda | |
| 2013/0260199 | A1 | 10/2013 | Min et al. | |
| 2014/0011070 | A1 | 1/2014 | Kim et al. | |
| 2014/0134472 | A1 | 5/2014 | Kim | |

FOREIGN PATENT DOCUMENTS

| | | |
|---|---|---|
| JP | 2008-204706 A | 9/2008 |
| JP | 2012-204172 A | 10/2012 |
| JP | 2013-524460 A | 6/2013 |
| JP | 2015-508223 A | 3/2015 |
| KR | 2001-0082058 A | 8/2001 |
| KR | 2001-0082059 A | 8/2001 |
| KR | 2001-0082060 A | 8/2001 |
| KR | 2003-0066960 A | 8/2003 |
| KR | 10-2012-0007459 A | 1/2012 |
| KR | 10-2012-0017597 A | 2/2012 |
| TW | 200306031 A | 11/2003 |
| TW | M274656 U | 9/2005 |
| TW | I258239 B | 7/2006 |
| TW | 201210771 A1 | 3/2012 |

OTHER PUBLICATIONS

Written Opinion of the International Searching Authority for PCT/KR2014/002684 mailed on Jul. 8, 2014.

Extended European Search Report, dated Jul. 10, 2015, for European Application No. 14761941.5.

Incra Build It System, "Coping Sled," Dec. 10, 2007, XP002741606, http://www.woodpeck.com/media/coping_sled_003.pdf, 1 page.

Taiwanese Office Action and Search Report, dated Jul. 7, 2015, for Taiwanese Application No. 103126009, with an English translation.

* cited by examiner

MEANDERING CORRECTION APPARATUS FOR ELECTRODE ASSEMBLY

CROSS-REFERENCE TO RELATED APPLICATIONS

This non-provisional application is a Continuation of International Application No. PCT/KR2014/002684 filed on Mar. 28, 2014, which claims priority to Korean Patent Application No. 10-2013-0092394 filed in Korea on Aug. 5, 2013. The entire contents of all of the above applications are hereby incorporated by reference.

BACKGROUND OF THE INVENTION

1. Field of the Invention

The present invention relates to a meandering correction apparatus for an electrode assembly, and more particularly, a meandering correction apparatus for an electrode assembly, which aligns first and second unit cells, that are stacked in multiple stages in a stack/folding type electrode assembly, in the same direction to fix the first and second unit cells.

2. Description of the Related Art

In general, secondary batteries have attracted considerable attention as power sources for electric vehicles (EVs), hybrid electric vehicles (HEVs), and plug-in hybrid electric vehicles (PHEVs), which have been developed to solve limitations such as air pollution, caused by existing gasoline and diesel vehicles that use fossil fuels.

In such a secondary battery, a medium to large-scale electrode assembly in which a plurality of unit cells are connected to each other is being used because medium to large-scale devices such as vehicles require an high-output and high-capacity.

Here, the electrode assembly for the secondary battery may be classified into a jelly-roll type electrode assembly in which at least anode, separator, and cathode are successively stacked, a stack/folding type electrode assembly in which a unit cell including an anode, a separator, and a cathode, which are successively stacked, is disposed on a separator having a long film shape, and then the separator is wound in a single direction, and a stack/folding type electrode assembly in which a unit cell including an anode, a separator, and a cathode, which are successively stacked, is disposed on a separator having a long film shape, and then is wound in a zigzag direction.

The stack/folding type electrode assembly of the above-described electrode assemblies are disclosed in detail in Korean Patent Publication Nos. 2001-0082058, 2001-0082059, and 2001-0082060, which are filed by the present applicant.

The stack/folding type electrode assembly according to the related art, as illustrated in FIG. 1, may be manufactured in a stepped shape and thus built in miniaturized products.

That is, as illustrated in FIG. 2, in the stack/folding type electrode assembly according to the related art, first and second unit cells 10 and 20 having sizes different from each other are disposed on a separator 30 having a long film shape, and then the separator 30 is wound in a single direction.

However, referring to FIG. 2, in the stack/folding type electrode assembly according to the related art, the lowermost second unit cell 20 is wound in a state where the second unit cell 20 is disposed on an end of the separator 30 having the long film shape. Thus, the second unit cell 20 may have fixed one end and the unfixed other end to cause meandering due to a flow phenomenon of the second unit cell 20.

SUMMARY OF THE INVENTION

To solve the above-described limitation, the prevent invention provides a meandering correction apparatus for an electrode assembly, which aligns first and second unit cells, that are stacked in multiple stages, to correct meandering.

According to an aspect of the present invention, there is provided a meandering correction apparatus for an electrode assembly, which corrects a position of a second unit cell to align a first unit cell with the second unit cell in the electrode assembly in which the first and second unit cells having sizes different from each other are folded through a separator, the meandering correction apparatus including: a main body on which the electrode assembly is disposed; a movable jig unit disposed on one side of the main body to press one side surface of the electrode assembly, thereby moving the electrode assembly toward the other side of the main body; and a correction jig unit disposed on the other side of the main body to support the other side surface of the electrode assembly that moves by the movable jig unit, thereby correcting the position of the second unit cell.

The correction jig unit may include a first correction jig supporting the other side surface of the second unit cell and a second correction jig stacked on the first correction jig to support the other side surface of the first unit cells while the first correction jig supports the other side surface of the second unit cell.

The correction jig unit may further include a fixing bolt that successively passes through the first and second correction jigs and then is fixed to the main body.

A long hole that lengthily extends in a direction of the electrode assembly may be defined in a top surface of the upper correction jig of the first and second correction jigs, and the fixing bolt may pass through the long hole.

According to another aspect of the present invention, there is provided a meandering correction apparatus for an electrode assembly, which aligns n unit cells with each other in the electrode assembly in which the n unit cells having sizes different from each other are folded through a separator, the meandering correction apparatus including: a main body on which the electrode assembly is disposed; a movable jig unit disposed on one side of the main body to press one side surface of the electrode assembly, thereby moving the electrode assembly toward the other side of the main body; and a correction jig unit disposed on the other side of the main body to support the other side surface of the electrode assembly that moves by the movable jig unit, thereby correcting the position of the second unit cell.

The correction jig unit may include n correction jigs respectively support the other side surfaces of the n unit cells of the electrode assembly that moves by the movable jig unit.

The correction jig unit may further include a fixing bolt that successively passes through the n correction jigs and then is coupled to the main body.

A long hole that lengthily extends in a direction of the electrode assembly may be defined in a top surface of at least one of the n correction jigs, and the fixing bolt may pass through the long hole.

The movable jig unit may be fixed slidable from one side of the main body to the other side.

A hook piece supporting each of both sides of the electrode assembly may be further disposed on each of both sides of the movable jig unit.

The meandering correction apparatus may further include a heating unit heating the correction jig unit to indirectly heat the separator, which is in contact with the correction jig unit, through the correction jig unit.

The heating unit may include an induction coil disposed on the correction jig unit and a generator applying current to the induction coil to generate heat.

The heating unit may heat the correction jig unit at a temperature of about 120° C. to about 170° C.

The meandering correction apparatus may further include a press jig unit supporting a top surface of the electrode assembly, which moves by the movable jig unit, above the main body.

The press jig unit may include an elevation piece vertically movably disposed above the main body and a hydraulic system for vertically elevating the elevation piece.

The meandering correction apparatus may further include a guide unit for forwardly or backwardly moving the second correction jig in a direction of the electrode assembly on homologous surfaces of the first and second correction jigs.

The guide unit may include a first guide groove lengthily defined in a top surface of the first correction jig in the direction of the electrode assembly and a guide protrusion disposed on a bottom surface of the second correction jig to slidably move along the guide groove.

The meandering correction apparatus may further include a guide unit for forwardly or backwardly moving one correction jig in a direction of the electrode assembly on homologous surfaces of the correction jigs facing each other of the n correction jigs.

The guide unit may include a first guide groove lengthily defined in a top surface of one of the two correction jigs in the direction of the electrode assembly and a guide protrusion disposed on a bottom surface of the other one of the two correction jigs to slidably move along the guide groove.

According to the present invention, the unit cells stacked in the multiple stages may be aligned with each other by using the meandering correction apparatus to correct the meandering and fix the unit cells, thereby preventing the product defects from occurring.

DETAILED DESCRIPTION OF THE EXEMPLARY EMBODIMENT

Figure 1:
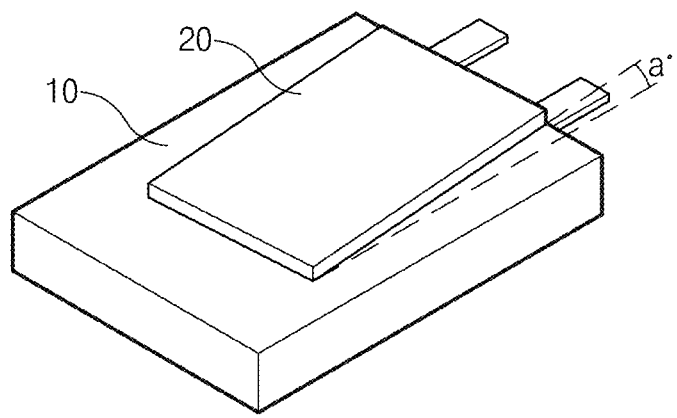
FIG. 1 is a perspective view of a stack/folding type electrode assembly according to a related art.
Figure 2:
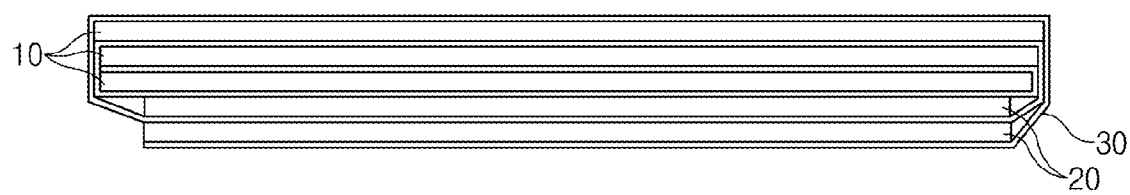
FIG. 2 is a cross-sectional view of the stack/folding type electrode assembly according to the related art.

A meandering correction apparatus for an electrode assembly according to the present invention uses a technology through which units cells stacked in a multiple stages are supported and aligned with each other to correct meandering of the electrode assembly, thereby preventing product defects from occurring.

Hereinafter, preferred embodiments of the present invention will be described in detail with reference to the accompanying drawings in such a manner that the technical idea of the present invention may easily be carried out by a person with ordinary skill in the art to which the invention pertains. The present invention may, however, be embodied in different forms and should not be construed as limited to the embodiments set forth herein. In the drawings, anything unnecessary for describing the present disclosure will be omitted for clarity, and also like reference numerals in the drawings denote like elements.

[Meandering Correction Apparatus for Electrode Assembly According to First Embodiment of the Present Invention]

Figure 3:
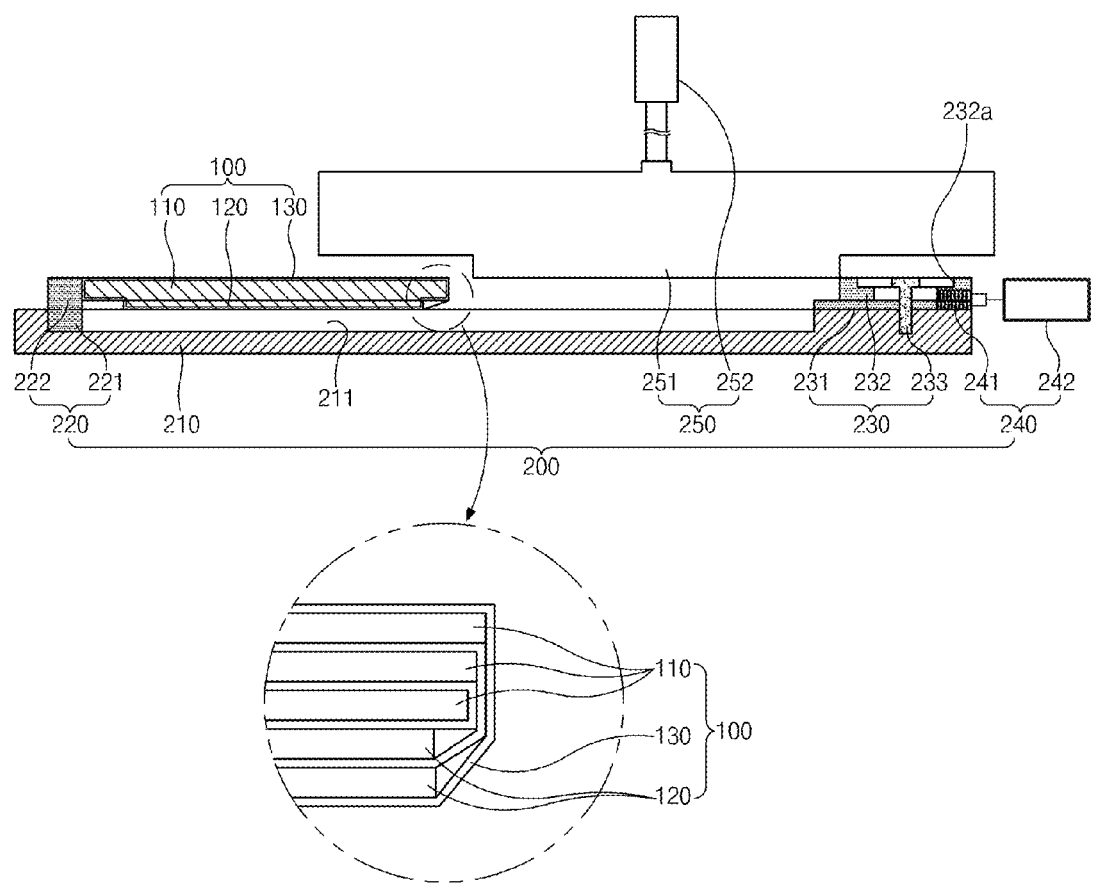
FIG. 3 is a cross-sectional view of a meandering correction apparatus for an electrode assembly according to a first embodiment of the present invention.

Referring to FIG. 3, an electrode assembly 100 includes first and second unit cells 110 and 120 having sizes different from each other and a separator 130 having a long film shape, which is wound in a single direction after the first and second unit cells 110 and 120 are disposed thereon.

For example, the first unit cell 110, the first unit cell 110, the second unit cell 120, the first unit call 110, and the second unit cell 120 are sequentially disposed on the separator 130 having the lone film shape, and then the separator 130 is wound from an end thereof, on which the initial first unit cell 110 is disposed, to the other end thereof.

As a result, the separate first unit cells 110 are vertically stacked, and the separate second unit cells 120 are vertically stacked to manufacture the electrode assembly 100 having a stepped structure.

Referring to FIG. 3, the lowermost second unit cell 120 is wound in a state where the lowermost second unit cell 120 is disposed on the other end of the separator 130 having the long film shape. Here, since the other end of the separator 130 is not fixed, the second unit cell 120 may horizontally move by an external impact or friction to cause the meandering.

To solve the above-described limitation, a meandering correction apparatus 200 for pressing the separate first and second unit cells 110 and 120, which are stacked in multiple stages, to correct the meandering is provided.

Figure 4:
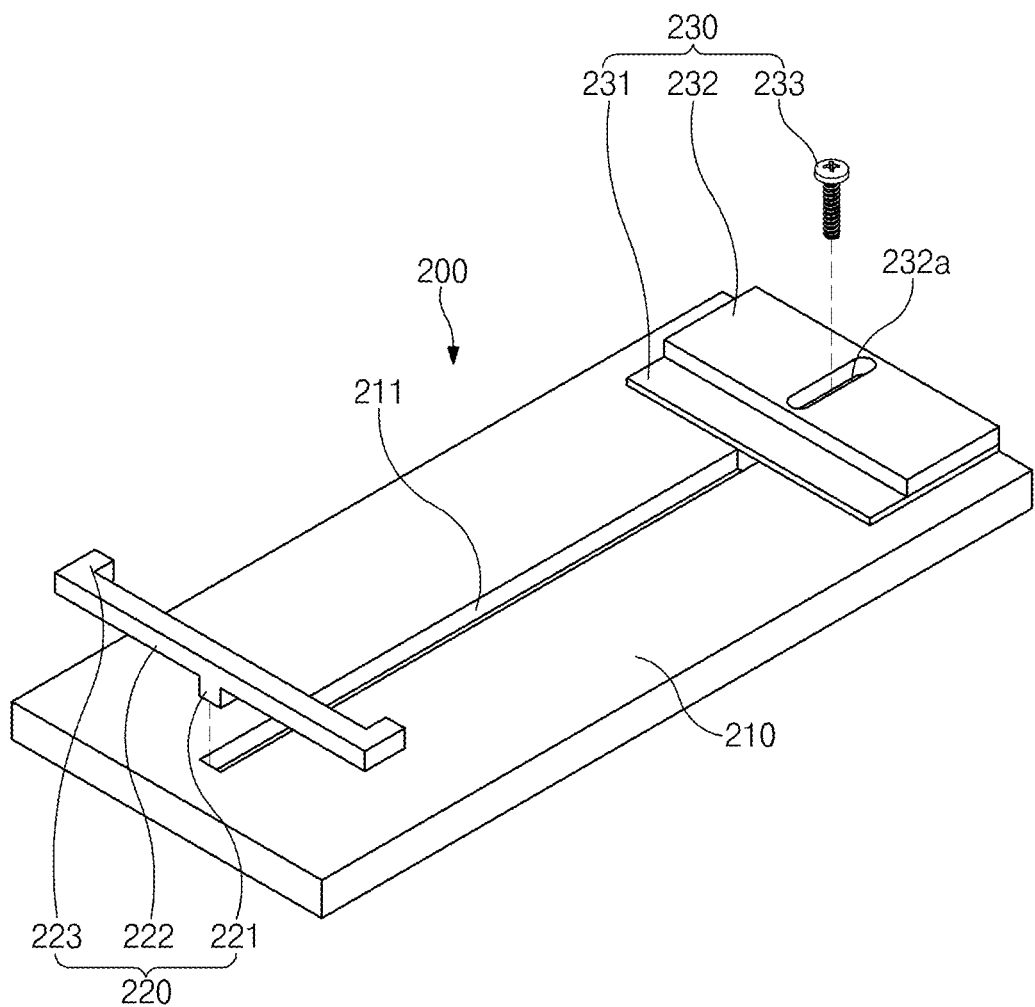
FIG. 4 is a perspective view of the meandering correction apparatus for the electrode assembly according to the first embodiment of the present invention.
Figure 5:
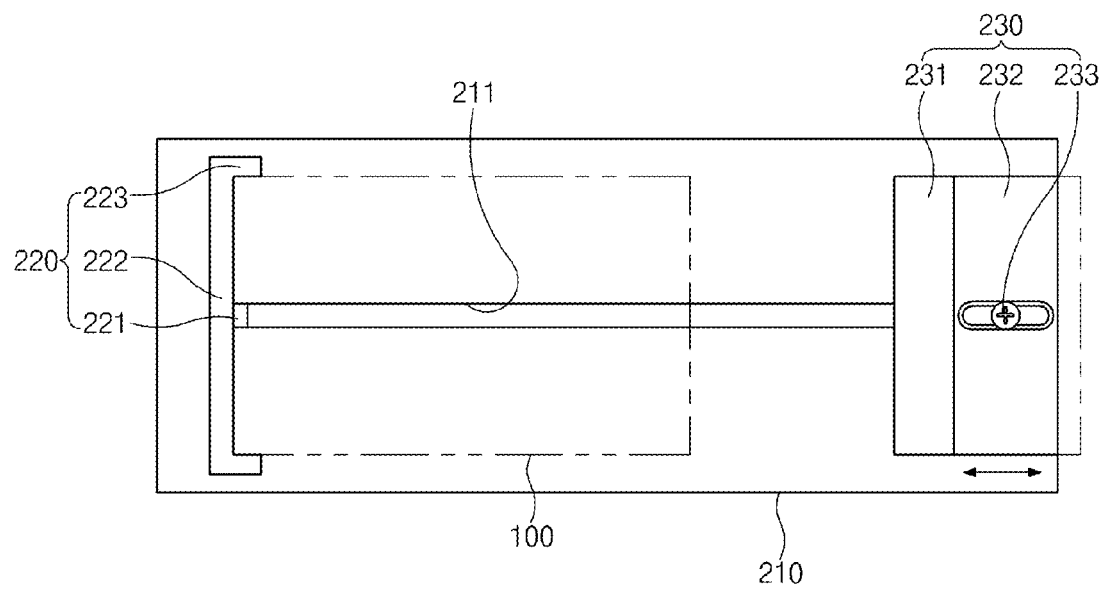
FIG. 5 is a plan view of the meandering correction apparatus for the electrode assembly according to the first embodiment of the present invention.

Referring to FIGS. 3 to 5, the meandering correction apparatus 200 for the electrode assembly according to the first embodiment of the present invention may correct a position of the second unit cell 120 to align the first and second unit cells 110 and 120 with each other in the electrode assembly 100. The meandering correction apparatus 200 includes a main body 210 on which the electrode assembly 100 is disposed, a movable jig unit 220 disposed on one side of the main body 210 to press one side surface of the electrode assembly 100, thereby moving the electrode assembly 100 toward the other side of the main body 210, and a correction jig unit 230 disposed on the other side of the main body 210 to support the other side surface of the electrode assembly 100 that moves by the movable jig unit 220, thereby correcting the position of the second unit cell 120.

The main body 210 may be provided as a flat plate having a flat top surface so that the electrode assembly 100 is disposed thereon. Also, the top surface of the main body 210 has one side on which the movable jig unit 220 is disposed and the other side on which the correction jig unit 230 is disposed.

Here, the electrode assembly 100 is disposed on the top surface of the main body 210 so that the separator 130 disposed between the outermost first unit cell 110 and the second unit cell 120 faces the correction jig unit 230.

Also, a guide groove 211 extending from one side of the top surface of the main body 210 to the other side is defined. Here, the movable jig unit 220 is slidably coupled to the guide groove 211.

One of a stepped portion, a character, and a line (not shown) for displaying an installation position of the correction jig unit 230 may be disposed on the other side of the top surface of the main body 210. Thus, the correction jig unit 230 may be installed at an exact location.

The movable jig unit 220 includes a guide piece 221 which is slide-movably inserted into the guide groove 211 and a support piece 222 disposed on the guide piece 221 in a width direction of the main body 210 to support one side surface of the electrode assembly 100.

That is, when the support piece 222 of the movable jig unit 220 is pushed to the other side of the main body 210, the electrode assembly 100 moves to the other side of the main body 210 together with the support piece 222. Here, since the guide piece 221 is slid along the guide groove 211, the electrode assembly may linearly move.

Here, the guide piece 221 of the movable jig unit 220 may be separable from the guide groove 211. Thus, the movable jig unit 220 having various sizes according to a length or height of the electrode assembly 100 may be inserted into the guide groove 211.

A hook piece 223 extending to the electrode assembly 100 to support a side portion of the electrode assembly 100 may be disposed on each of both side portions of the support piece 222 to prevent the electrode assembly 100 from being separated.

The correction jig unit 230 includes a first correction jig 231 supporting the other side surface of the second unit cell 120 and a second correction jig 232 stacked on the first correction jig 231 to support the other side surface of the first unit cell 110 while the first correction jig 231 supports the other side surface of the second unit cell 120. Here, a fixing bolt 233 successively passes through the first and second correction jigs 231 and 232 and then is fixed to the main body 210.

That is, in the correction jig unit 230, the first and second correction jigs 231 and 232 having sizes different from each other are stacked on each other and then are fixed to the main body 210 by using a fixing bolt 233.

A long hole 232a extending to the electrode assembly 100 is defined in a top surface of the second correction jig 232 that is the uppermost correction jig when viewed in FIG. 3. Here, the fixing bolt 223 passes through the long hole 232a.

That is, the second correction jig 232 may forwardly or backwardly move in the long hole 232a in a state where the fixing bolt is not fully fastened. As a result, the second correction jig 232 may be adjusted in position to suit a distance between the first and second unit cells 110 and 120, thereby adjusting a distance between the first and second correction jigs 231 and 232.

As described above, in the correction jig unit 230, the second and first unit cells 120 and 110 are supported on the first and second correction jigs 231 and 232 at the same time. Here, the meandered second unit cell 120 may be closely surface-attached to the first correction jig 231 and corrected in position to align the first and second unit cells 110 and 120 with each other.

The meandering correction apparatus 200 may further include a heating unit 240 that heats the correction jig unit 230 to indirectly heat the separator 130 that is folded with the first and second unit cells 110 and 120 supported by the correction jig unit 230.

The heating unit 240 includes an induction coil 241 disposed on the correction jig unit 230 and a generator 242 applying current to the induction coil 241 to generate heat.

Here, the heating unit 240 may heat the correction jig unit 230 at a temperature of about 120° C. to about 170° C. That is, if the heating unit 240 heats the correction jig unit 230 at a temperature of about 120° C. or less, the separator 130 may not be solidly coagulated. On the other hand, if the heating unit 240 heats the correction jig unit 230 at a temperature of about 170° C. or more, the separator 130 may be damaged.

Figure 8:
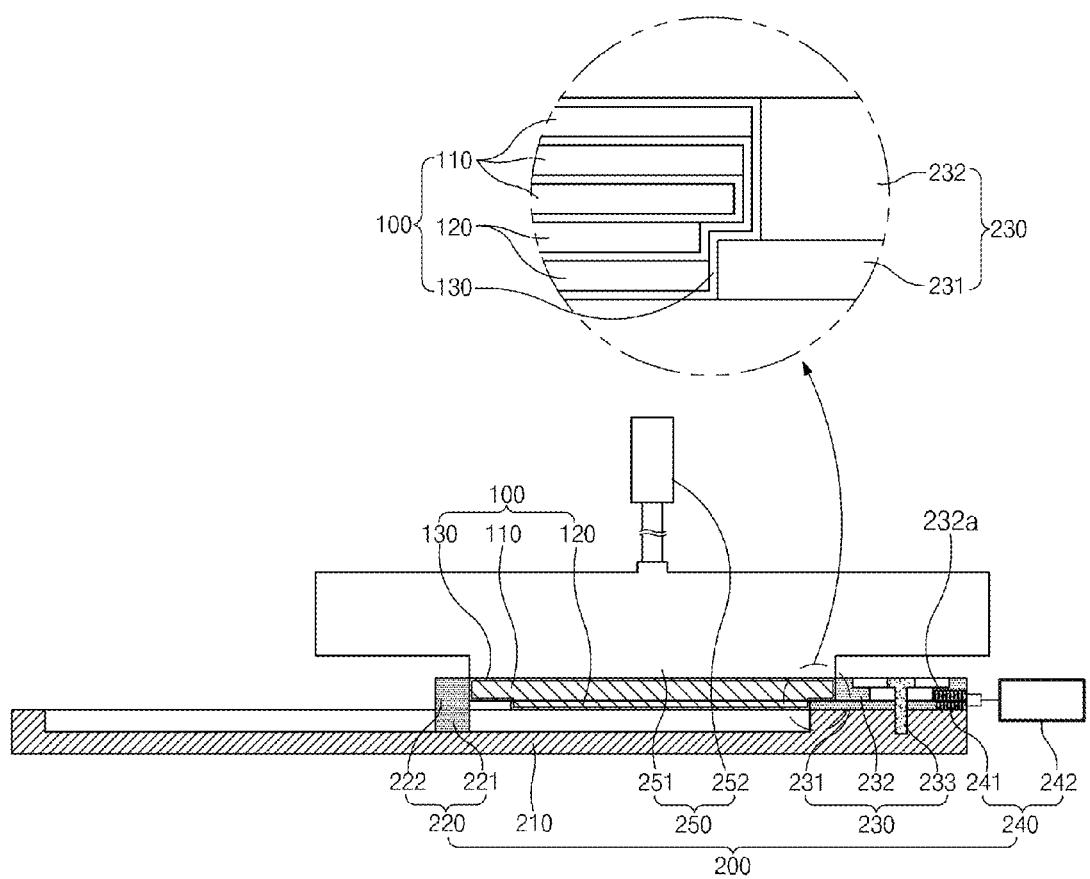

That is, the separator 130 between the lowermost second unit cell 120 and the first unit cell 110 may be supported and pressed to the second unit cell 120 by the first correction jig 231 (see FIG. 8). Here, the first correction jig 231 heated by the heating unit 240 may indirectly heat the separator 130 to melt a coating material having adhesion and applied to the separator 130. Thus, the wound separator 130 may adhere to the second unit cell 120 to fix the outermost second unit cell 120 without moving, thereby preventing the meandering from occurring.

A press jig unit 250 supporting the top surface of the electrode assembly 100 that moves by the movable jig unit 220 may be further provided above the main body 210 of the meandering correction apparatus 200.

The press jig unit 250 includes an elevation piece 251 that is vertically movably dispose above the main body 210 and a hydraulic system 252 for vertically elevating the elevation piece 251.

That is, the press jig unit 250 allows the electrode assembly 100 to be supported by the correction jig unit 230 without being lifted upward. Thus, the electrode assembly 100 may be stably supported on the correction jig unit 230 by the press jig unit 250.

A meandering correction method using the meandering correction apparatus for the electrode assembly including the above-described constitutions will now be described.

Figure 6:
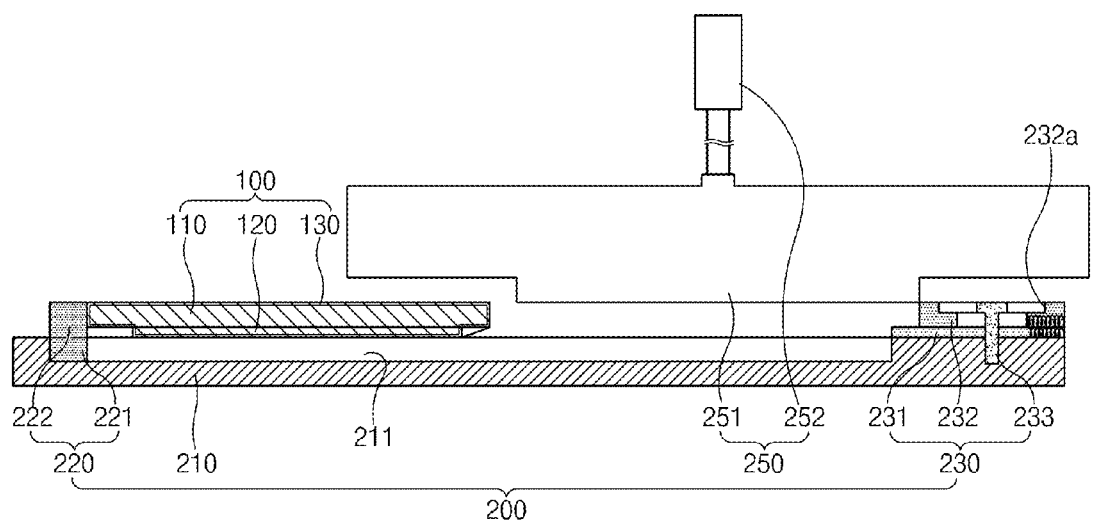
FIGS. 6 to 8 are views of the meandering correction apparatus for the electrode assembly according to the first embodiment of the present invention.

Referring to FIG. 6, the correction jig unit 230 is heated at a preset temperature by the heating unit 240. Then, the elevation piece 251 descends up to a height of the electrode assembly, of which meandering will be corrected, by using the hydraulic system 252 of the press jig unit 250.

Figure 7:
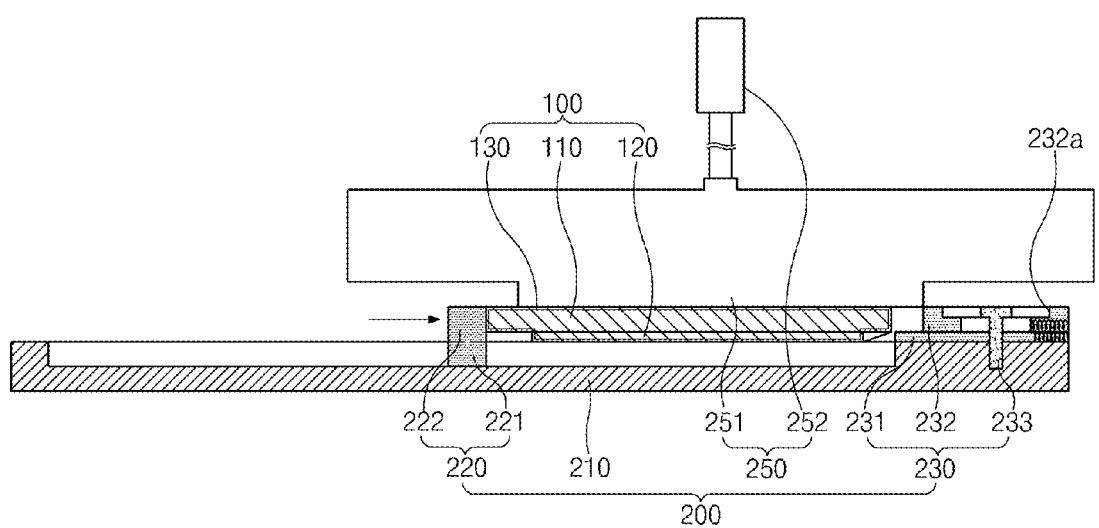

Then, as illustrated in FIG. 7, the electrode assembly 100 is disposed on the top surface of the main body 210 between the movable jig unit 220 and the correction jig unit 230. Thereafter, when the movable jig unit 220 moves toward the correction jig unit 230, the movable jig unit 220 may move together with the electrode assembly 100 while pressing one side surface of the electrode assembly 100.

As described above, the electrode 100 may be supported by the correction jig unit 230 while moving by the movable jig unit 220 as illustrated in FIG. 7. Here, the first and second unit cells 110 and 120 may be supported by the second and first correction jigs 232 and 231 at the same time, and the second unit cell 120 may be corrected in angle. As a result, the first and second unit cells 110 and 120 may be aligned with each other to correct the meandering.

Simultaneously, the separator 130 folded with the first and second unit cells 110 and 120 may be indirectly heated by the correction jig unit 230. Thus, the coating material having the adhesion and applied to the separator 130 may be melted to adhere to the separator 130 folded with the first unit cell 110, thereby fixing the second unit cell 120.

Hereinafter, in description of a meandering correction apparatus of an electrode assembly according to another embodiment of the present invention, components of the two embodiments having the same construction and function have been given the same reference numeral in the drawings, and thus duplicated description will be omitted.

Figure 9:
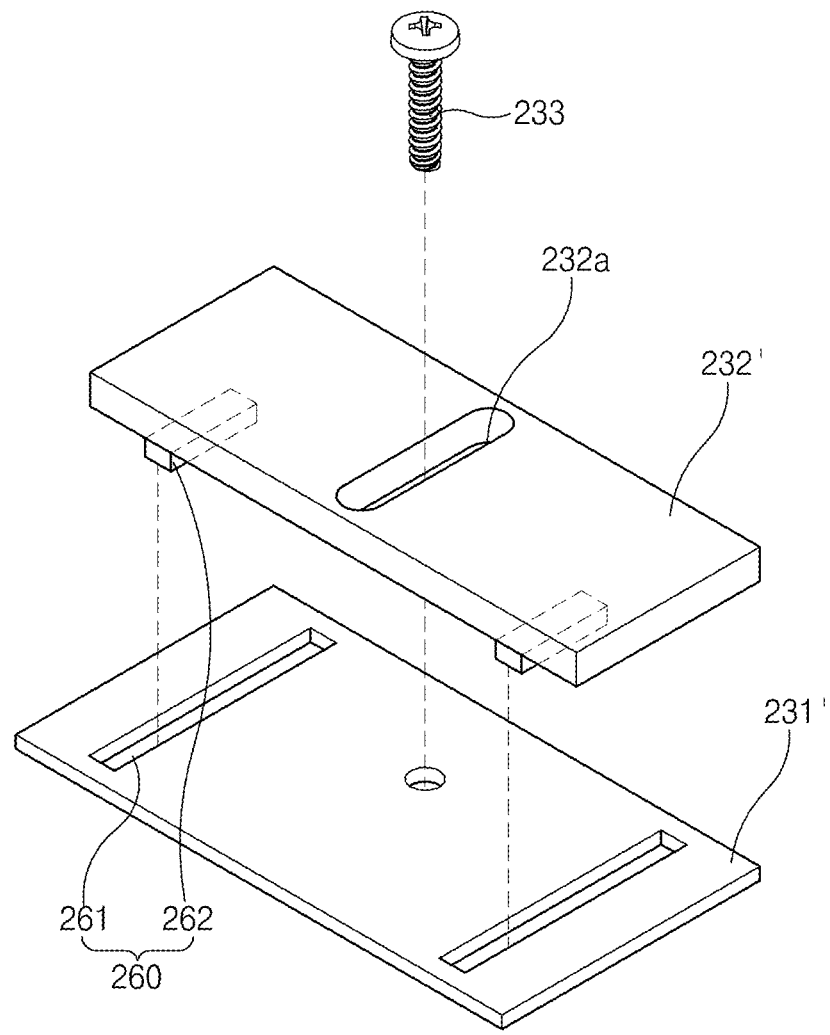
FIG. 9 is a perspective view of a correction jig unit in the meandering correction apparatus for the electrode assembly according to the first embodiment of the present invention.

Referring to FIG. 9, the meandering correction apparatus for the electrode assembly according to the current embodiment may further include a guide unit 260 for forwardly or backwardly moving a second correction jig 232' toward an electrode assembly 100 on homologous surfaces of first and second correction jigs 231' and 232'.

That is, the guide unit 260 includes a first guide groove 261 lengthily defined in a top surface of the first correction jig 231' in a direction of the electrode assembly 100 and a guide protrusion 262 disposed on a bottom surface of the second correction jig 232' to slidably move along the guide groove 261.

Thus, the guide unit 260 may horizontally move the second correction jig 232' in a straight line to prevent the second correction jig 232' from being changed in angle.

Although the unit cell is corrected in position in the two-stepped electrode assembly including the first and second unit cells in the current embodiment, the present invention is not limited thereto. For example, the unit cell may be corrected in position in at least three-stepped electrode assembly.

Hereinafter, in description of a meandering correction apparatus of an electrode assembly according to another embodiment of the present invention, components of the current embodiment having the same construction and function as the first embodiment have been given the same reference numeral in the drawings, and thus duplicated description will be omitted.

[Meandering Correction Apparatus for Electrode Assembly According to Second Embodiment of the Present Invention]

An electrode assembly may be manufactured by folding n unit cells having sizes different from each other through a separator sheet.

Figure 10:
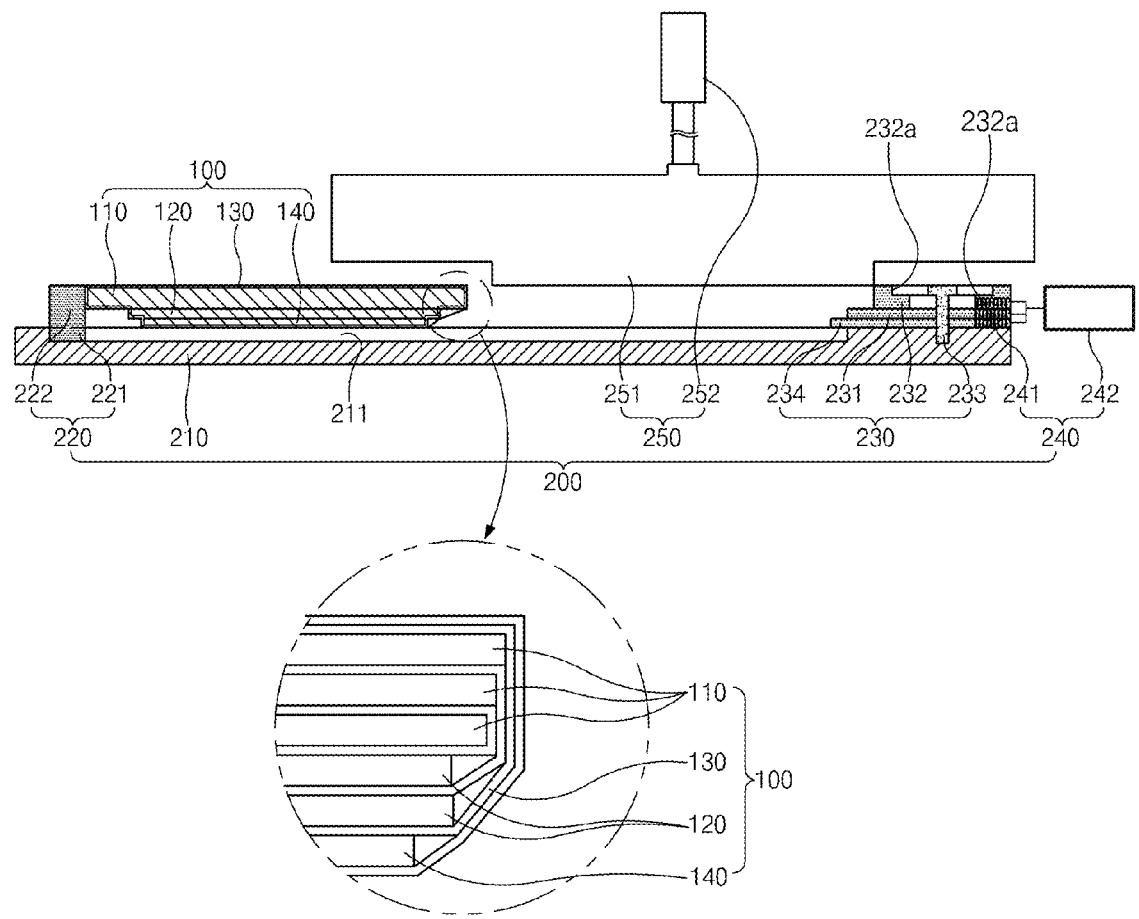
FIG. 10 is a cross-sectional view of a meandering correction apparatus for an electrode assembly according to a second embodiment of the present invention.

For example, as illustrated in FIG. 10, the electrode assembly 100 may be manufactured by folding first, second, and third unit cells 110, 120, 140 having sizes different from each other through a separator 130 (for reference, each unit cell may be formed by stacking a plurality of cells having the same size).

As described above, the electrode assembly 100 in which the n unit cells are folded through the separator sheet may be corrected in meandering by using the meandering correction apparatus 200 for the electrode assembly to prevent product defects from occurring.

That is, the meandering correction apparatus 200 for the electrode assembly according to the second embodiment of the present invention may align the n unit cells in the electrode assembly 100 in which the n unit cells having sizes different from each other are stacked. The meandering correction apparatus 200 includes a main body 210 on which the electrode assembly 100 is disposed, a movable jig unit 220 disposed on one side of the main body 210 to press one side surface of the electrode assembly 100, thereby moving the electrode assembly 100 toward the other side of the main body 210, and a correction jig unit 230 disposed on the other side of the main body 210 to support the other side surface of the electrode assembly 100 that moves by the movable jig unit 200, thereby correcting a position of each of the unit cells.

Since the main body 210 and the movable jig unit 220 have the same construction and function as those of the foregoing first embodiment, their detailed descriptions will be omitted.

Here, the correction jig unit 230 includes n correction jigs for respectively supporting the other side surfaces of the n unit cells of the electrode assembly 100 that moves by the movable jig unit 220.

Also, the correction jig unit 230 may further include a fixing bolt that successively passes through the n correction jigs and then is fixed to the main body 210.

Here, the correction jig unit 230 having a three-stepped structure will be described as an example.

Referring to FIG. 10, the correction jig unit 230 having the three-stepped structure includes a third correction jig 234 supporting the other side surface of a third unit cell 140, a first correction jig 231 stacked on the third correction jig 234 to support the other side surface of a second unit cell 120, and a second correction jig 232 stacked on the first correction jig 231 to support the other side surface of a first unit cell 110. The third, first, and second correction jigs 234, 231, and 232 are fixed by the fixing bolt 233 that successively passes through to the third, first, and second correction jigs 234, 231, and 232 and than is fixed to the main body 210.

That is, in the correction jig unit 230 having the three-stepped structure, the third, first, and second correction jigs 234, 231, and 232 may correct meandering of the third, second, and first unit cells 140, 120, and 110 while being supported on the other side surfaces of the third, second, and first unit cells 140, 120, and 110, respectively.

At least one of the n correction jigs has a long hole 232a that lengthily extends in a direction of the electrode assembly 100 in a top surface thereof. Here, the fixing bolt 233 may pass through the long hole 232a.

That is, the correction jig having the long hole 232a may move in the direction of the electrode assembly 100 to adjust a position of the correction jig so as to suit a distance between the unit cells.

Thus, the meandering correction apparatus 200 for the electrode assembly according to the second embodiment of the present invention may easily correct the meandering of the electrode assembly 100 in which the n unit cells are stacked.

Accordingly, the scope of the present invention is defined by the appended claims rather than the foregoing description and the exemplary embodiments described therein. Various modifications made within the meaning of an equivalent of the claims of the invention and within the claims are to be regarded to be in the scope of the present invention.

The invention claimed is:

1. A meandering correction apparatus which corrects a position of a second unit cell to align a first unit cell with the second unit cell such that their respective edges are parallel with one another in an electrode assembly in which the first and second unit cells having sizes different from each other are folded with a separator so as not to contact each other, wherein the electrode assembly has one side surface and an other side surface that is opposite of the one side surface, the meandering correction apparatus comprising:

a main body on which the electrode assembly is disposed, wherein the main body has one side and an other side that is opposite of the one side;

a movable jig unit disposed on the one side of the main body to press the one side surface of the electrode assembly, thereby moving the electrode assembly toward the other side of the main body;

a correction jig unit disposed on the other side of the main body to support the other side surface of the electrode assembly that moves by the movable jig unit, thereby correcting the position of the second unit cell; and a heating unit heating the correction jig unit to indirectly heat the separator, which is in contact with the correction jig unit, through the correction jig unit, wherein the movable jig unit further comprises a hook piece supporting two end sides of the electrode assembly, wherein the two end sides extend in a direction perpendicular to a direction in which the electrode assembly moves, wherein the first unit cell has one side surface and an other side surface that is opposite the one side surface of the first unit cell, wherein the second unit cell has one side surface and an other side surface that is opposite the one side surface of the second unit cell, wherein the correction jig unit comprises a first correction jig supporting the other side surface of the second unit cell and a second correction jig stacked on the first correction jig to support the other side surface of the first unit cell while the first correction jig supports the other side surface of the second unit cell, wherein the first correction jig is heated by the heating unit and heats and presses the separator to melt a coating material having adhesion so that the separator adheres to the second unit cell, and wherein the correction jig unit further comprises a fixing bolt that successively passes through the first and second correction jigs and then is fixed to the main body.

2. The meandering correction apparatus of claim 1, wherein a long hole that lengthily extends in a direction of the electrode assembly is defined in a top surface of the second correction jig, and the fixing bolt passes through the long hole.

3. The meandering correction apparatus of claim 1, wherein the movable jig unit is arranged on the main body so as to be slidable from one side of the main body to the other side of the main body.

4. The meandering correction apparatus of claim 1, wherein the heating unit comprises an induction coil disposed on the correction jig unit and a generator applying current to the induction coil to generate heat.

5. The meandering correction apparatus of claim 1, wherein the heating unit heats the correction jig unit at a temperature of about 120° C. to about 170° C.

6. The meandering correction apparatus of claim 1, further comprising a press jig unit disposed above the main body, wherein the press jig unit supports a top surface of the electrode assembly, which moves by the movable jig unit.

7. The meandering correction apparatus of claim 6, wherein the press jig unit comprises an elevation piece vertically moveable; and a hydraulic system for vertically elevating the elevation piece.

8. The meandering correction apparatus of claim 1, wherein the second correction jig is offset relative to an edge of the first correction jig.

9. The meandering correction apparatus of claim 8, wherein the offset is in a direction parallel to the direction that the electrode assembly is moved by the movable jig.

\* \* \* \* \*